(12) United States Patent
Ogawa

(10) Patent No.: US 9,153,429 B2
(45) Date of Patent: Oct. 6, 2015

(54) FILM DEPOSITION APPARATUS HAVING A TURNTABLE AND FILM DEPOSITION METHOD

(71) Applicant: Tokyo Electron Limited, Tokyo (JP)

(72) Inventor: Jun Ogawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 37 days.

(21) Appl. No.: 14/106,926

(22) Filed: Dec. 16, 2013

(65) Prior Publication Data

US 2014/0179120 A1    Jun. 26, 2014

(30) Foreign Application Priority Data

Dec. 21, 2012    (JP) .................................. 2012-279920

(51) Int. Cl.
*H01L 21/00* (2006.01)
*H01L 21/02* (2006.01)
*C23C 16/34* (2006.01)
*C23C 16/40* (2006.01)
*C23C 16/455* (2006.01)

(52) U.S. Cl.
CPC .......... *H01L 21/02164* (2013.01); *C23C 16/34* (2013.01); *C23C 16/405* (2013.01); *C23C 16/4551* (2013.01); *H01L 21/0217* (2013.01); *H01L 21/0228* (2013.01); *H01L 21/02175* (2013.01); *H01L 21/02178* (2013.01); *H01L 21/02181* (2013.01); *H01L 21/02186* (2013.01); *H01L 21/02189* (2013.01); *H01L 21/02312* (2013.01); *H01L 21/02337* (2013.01)

(58) Field of Classification Search
None
See application file for complete search history.

(56) References Cited

U.S. PATENT DOCUMENTS

2004/0237893 A1* 12/2004 Park et al. ...................... 118/715
2012/0267341 A1* 10/2012 Kato et al. ........................ 216/37

FOREIGN PATENT DOCUMENTS

JP    4661990    3/2011

* cited by examiner

*Primary Examiner* — Scott B Geyer
*Assistant Examiner* — Brigitte Paterson
(74) *Attorney, Agent, or Firm* — IPUSA, PLLC

(57) ABSTRACT

A method of depositing a film of forming an oxide film containing a predetermined element on substrates using an apparatus including a turntable mounting substrates, first and second process areas above the upper surface of the turntable provided with gas supplying portions, a separation gas supplying portion between the first and second process areas, and a separation area including depositing the oxide film by rotating the turntable while supplying a reaction gas containing the predetermined element, the oxidation gas from the second gas supplying portion, and the separation gas; and rotating at least one turn while supplying the separation gas from the first gas supplying portion and the separation gas supplying portion, and the oxidation gas from the second gas supplying portion.

17 Claims, 8 Drawing Sheets

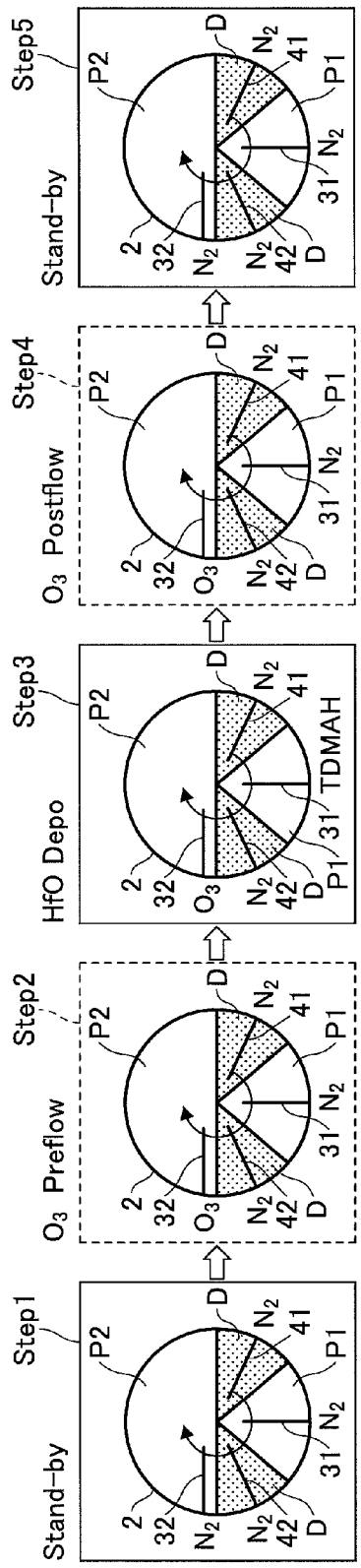

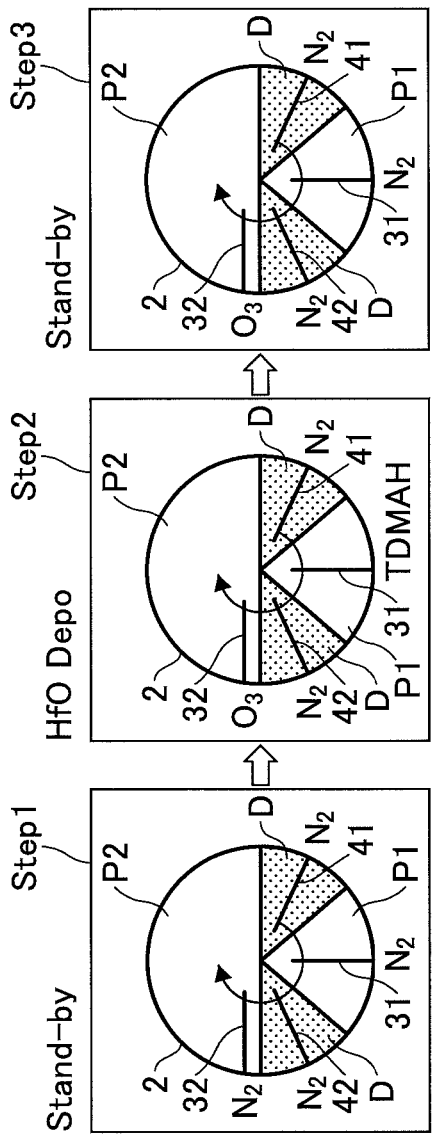

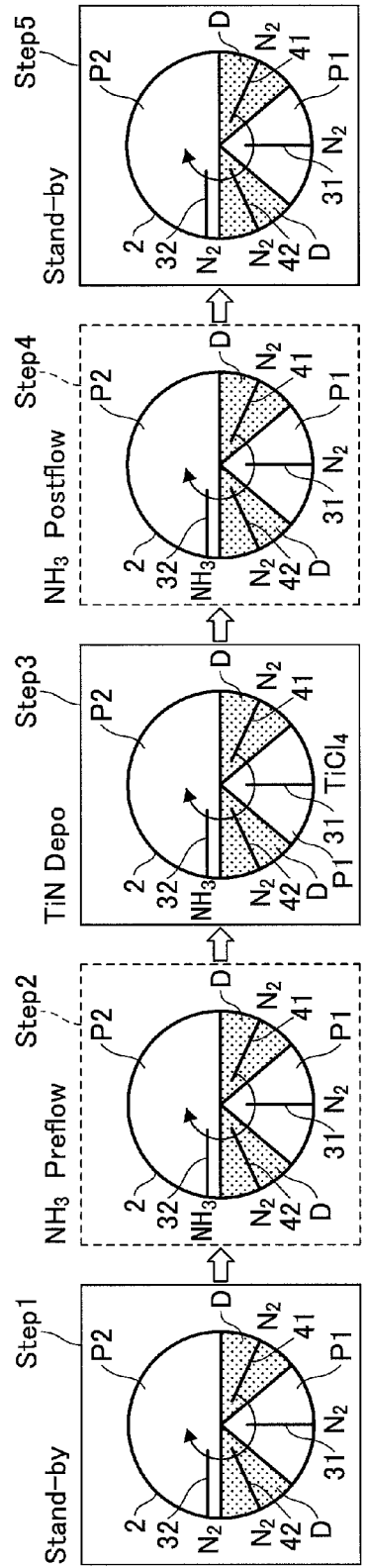

FILM DEPOSITION APPARATUS HAVING A TURNTABLE AND FILM DEPOSITION METHOD

CROSS-REFERENCE TO RELATED APPLICATIONS

This patent application is based upon and claims the benefit of priority of Japanese Patent Application No. 2012-279920 filed on Dec. 21, 2012, the entire contents of which are incorporated herein by reference.

BACKGROUND OF THE INVENTION

1. Field of the Invention

The present invention relates to a method of depositing a film. More specifically, the present invention relates to method of depositing an oxide film or a nitride film.

2. Description of the Related Art

A manufacturing process of a semiconductor integrated circuit (IC) includes a process of depositing a thin film on a semiconductor wafer. In this process, improvement in evenness of a surface of a wafer is required in view of further microminiaturization of an IC. As a method of depositing a film to satisfy this requirement, a method of depositing the film called an atomic layer deposition (ALD) method or a molecular layer deposition (MLD) method is considered. According to the ALD method, a cycle, in which one (a reaction gas A) of reaction gases which mutually react is caused to adsorb on the surface of the wafer, and the adsorbing reaction gas A is reacted with the other one (a reaction gas B) of the reaction gases, is repeated to thereby deposit a thin film made of a reaction product on the surface of the wafer. Because the ALD method uses the adsorption of the reaction gas onto the surface of the wafer, the ALD method has an advantage that film thickness evenness and film thickness controllability are excellent.

A turntable-type film deposition apparatus is disclosed in Japanese Patent No. 4661990 as a film deposition apparatus performing the ALD method. This film deposition apparatus includes a turntable, which is rotatable and is positioned in a vacuum chamber, and on which a plurality of wafers are mounted, a separating area that is laid out above the turntable and separates a gas supplying area for the reaction gas A from a gas supplying area for the reaction gas B, evacuation ports corresponding to the gas supplying areas where the reaction gas A and the reaction gas B are supplied, and an evacuation device connected to these evacuation ports. In this film deposition apparatus, the wafers pass through the gas supplying area for the reaction gas A, the separating area, the gas supplying area for the reaction gas B, and the separating area along rotation of the turntable. With this, the reaction gas A adsorbs onto the surface of the wafer in the gas supplying area for the reaction gas A, and the reaction gas A reacts with the reaction gas B in the gas supplying area for the reaction gas B. Therefore, it is not necessary to change the reaction gas A to the reaction gas B while depositing the film, and the reaction gases A, and B can be continuously supplied. Therefore, there is an advantage that an evacuation/purge process is unnecessary thereby shorting a time period for depositing the film.

In a case where an oxide film containing a predetermined element is deposited using the above turn-table type film deposition apparatus, by using the reaction gas A being a reaction gas containing the above predetermined element such as a silicon gas containing silicon and the reaction gas B being an oxide gas such as ozone, an oxide film containing a predetermined element can be formed. In this case, a gas containing the predetermined element adsorbs firstly onto the surface of the wafer, an oxidation gas (the reaction gas B) is supplied onto the surface of the wafer, and the reaction gas A and the reaction gas B react thereby depositing a molecular layer containing the predetermined element. As described, the reaction gas containing the predetermined element adsorbs firstly onto the surface of the wafer and reacts with the oxidation gas on the surface of the wafer. Thus, the oxide film containing the predetermined element is deposited on the surface of the wafer.

SUMMARY OF THE INVENTION

Accordingly, embodiments of the present invention may provide a novel and useful method of depositing a film.

According to an aspect of the present invention, there is provided a method of depositing a film of forming an oxide film containing a predetermined element on a plurality of substrates using a film deposition apparatus including a turntable that is accommodated in a chamber, is rotatable, and includes mounting portions formed on an upper surface of the turntable so that the substrates are mounted on the mounting portions, a first process area laid out above the upper surface of the turntable and being provided with a first gas supplying portion, which supplies gases toward the upper surface of the turntable, a second process area arranged apart from the first process area along a peripheral direction of the turntable and being provided with a second gas supplying portion, which supplies the gases toward the upper surface of the turntable, a separation gas supplying portion provided between the first process area and the second process area and supplying a separation gas onto the upper surface of the turntable, and a separation area including a ceiling surface forming a narrow space so that the narrow space for introducing the separation gas supplied from the separation gas supplying portion to the first process area and the second process area is formed between the ceiling surface and the surface of the turntable including a first process of rotating the turntable at least one turn while the separation gas is supplied from the first gas supplying portion and the separation gas supplying portion, and an oxidation gas is supplied from the second gas supplying portion; a second process of depositing the oxide film containing the predetermined element onto the substrates by rotating the turntable a predetermined number of turns while a reaction gas containing the predetermined element is supplied from the first gas supplying portion, the oxidation gas is supplied from the second gas supplying portion, and the separation gas is supplied from the separation gas supplying portion; and a third process of rotating the turntable at least one turn under a state where the separation gas is supplied from the first gas supplying portion and the separation gas supplying portion, and the oxidation gas is supplied from the second gas supplying portion.

According to another aspect of the present invention, there is provided a method of depositing a film of forming a nitride film containing a predetermined element on a plurality of substrates using a film deposition apparatus including a turntable that is accommodated in a chamber, is rotatable, and includes mounting portions formed on an upper surface of the turntable so that the substrates are mounted on the mounting portions, a first process area laid out above the upper surface of the turntable and being provided with a first gas supplying portion, which supplies gases toward the upper surface of the turntable, a second process area arranged apart from the first process area along a peripheral direction of the turntable and being provided with a second gas supplying portion, which supplies the gases toward the upper surface of the turntable, a separation gas supplying portion provided between the first process area and the second process area and supplying a separation gas onto the upper surface of the turntable, and a separation area including a ceiling surface forming a narrow space so that the narrow space for introducing the separation gas supplied from the separation gas supplying portion to the first process area and the second process area is formed between the ceiling surface and the surface of the turntable including a first process of rotating the turntable at least one turn while the separation gas is supplied from the first gas supplying portion and the separation gas supplying portion, and an nitriding gas is supplied from the second gas supplying portion; a second process of depositing the nitride film containing the predetermined element onto the substrates by rotating the turntable a predetermined number of turns while a reaction gas containing the predetermined element is supplied from the first gas supplying portion, the nitriding gas is supplied from the second gas supplying portion, and the separation gas is supplied from the separation gas supplying portion; and a third process of rotating the turntable at least one turn under a state where the separation gas is supplied from the first gas supplying portion and the separation gas supplying portion, and the nitriding gas is supplied from the second gas supplying portion.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 6A is a sequential diagram illustrating an example of the method of depositing the film of the first embodiment of the present invention by using a turntable;

FIG. 6B is a timing chart illustrating the example of the method of depositing the film of the first embodiment of the present invention;

FIG. 7 is a sequential diagram illustrating an exemplary method of depositing a film by using a turntable as a comparative example;

FIG. 8A is a sequential diagram illustrating an example of the method of depositing the film of a second embodiment of the present invention by using a turntable; and FIG. 8B is a timing chart illustrating the example of the method of depositing the film of the second embodiment of the present invention.

DETAILED DESCRIPTION OF EMBODIMENTS

In a case where an oxide film containing a predetermined element is deposited on each of a plurality of wafers using the above method of depositing the film, because the plurality of wafers are arranged along a peripheral direction of the turntable, when a reaction gas A (an element containing gas) and a reaction gas B (an oxidation gas) are simultaneously supplied and a film deposition process is started, not all the plurality of wafers arranged in the circumferential direction are supplied with the reaction gas A. Therefore, there are a wafer started to be supplied with the reaction gas A and another wafer started to be supplied with the reaction gas B. Then, there are the wafer whose film deposition process is started after the oxidation of the wafer and the other wafer whose film deposition process is started without the oxidation of the wafer. Accordingly, there are problems that uniform film deposition cannot be performed among the wafers and film deposition among the wafers is unbalanced.

Further, when supplies of the reaction gases A and B are simultaneously stopped after finishing the film deposition process, only the reaction gas A is supplied. Therefore, there are a wafer whose film deposition process is finished under a state where the reaction gas A adsorbs onto the surface of the wafer by being supplied with only the reaction gas A and another wafer whose film deposition process is finished under a state where the oxide film is deposited onto the surface of the wafer by being supplied with both the reaction gases A and B. Accordingly, there is a problem that the film deposition among the wafers is unbalanced.

Further, the above problems may occur in a film deposition process of depositing a nitride film in a manner similar to the above.

A description is given below, with reference to the figures of the embodiments of the present invention.

In the embodiments described below, the reference symbols typically designate as follows:

1: chamber;
2: turntable;
4: convex portion;
11: ceiling plate;
12: chamber body;
15: transfer opening;
24: circular concave portion (wafer mounting portion);
31, 32: reaction gas nozzle;
4, 42: separation gas nozzle;
D: separating area;
P1: first process area;
P2: second process area;
H: separation space; and
W: wafer.

In the above-mentioned figures, the same or corresponding reference symbols are attached to the same or corresponding members and parts, and description of overlapping explanation is omitted. Further, in the figures, relative ratios among the members and the parts are not intended to be illustrated. Therefore, dimensions are to be practically determined by a person ordinarily skilled in art in light of the following non-limiting embodiment.

First Embodiment

Film Deposition Apparatus

Figure 1:
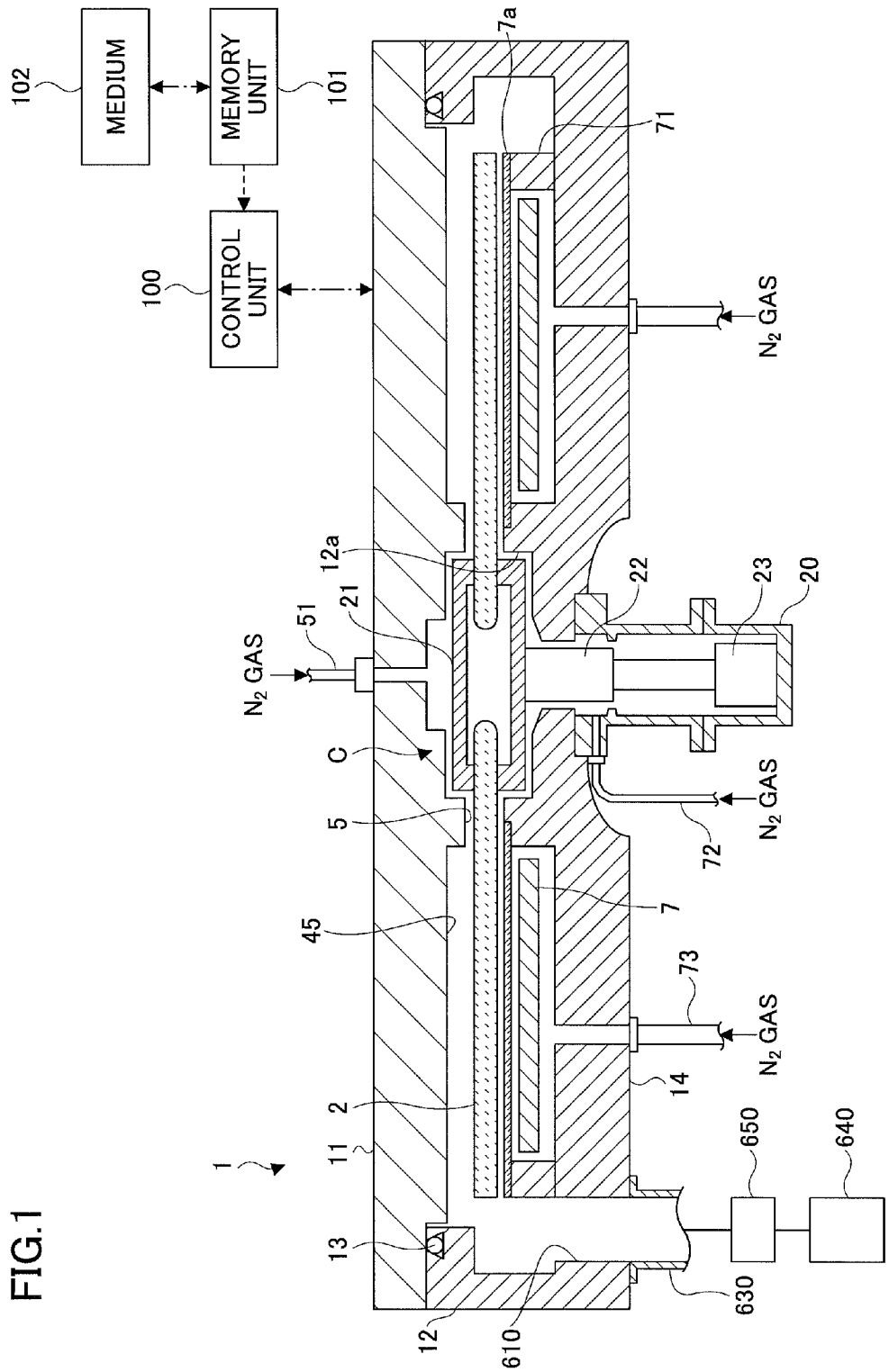
FIG. 1 is a cross-sectional view for illustrating a film deposition apparatus preferable for performing a method of depositing a film of an embodiment of the present invention.
Figure 2:
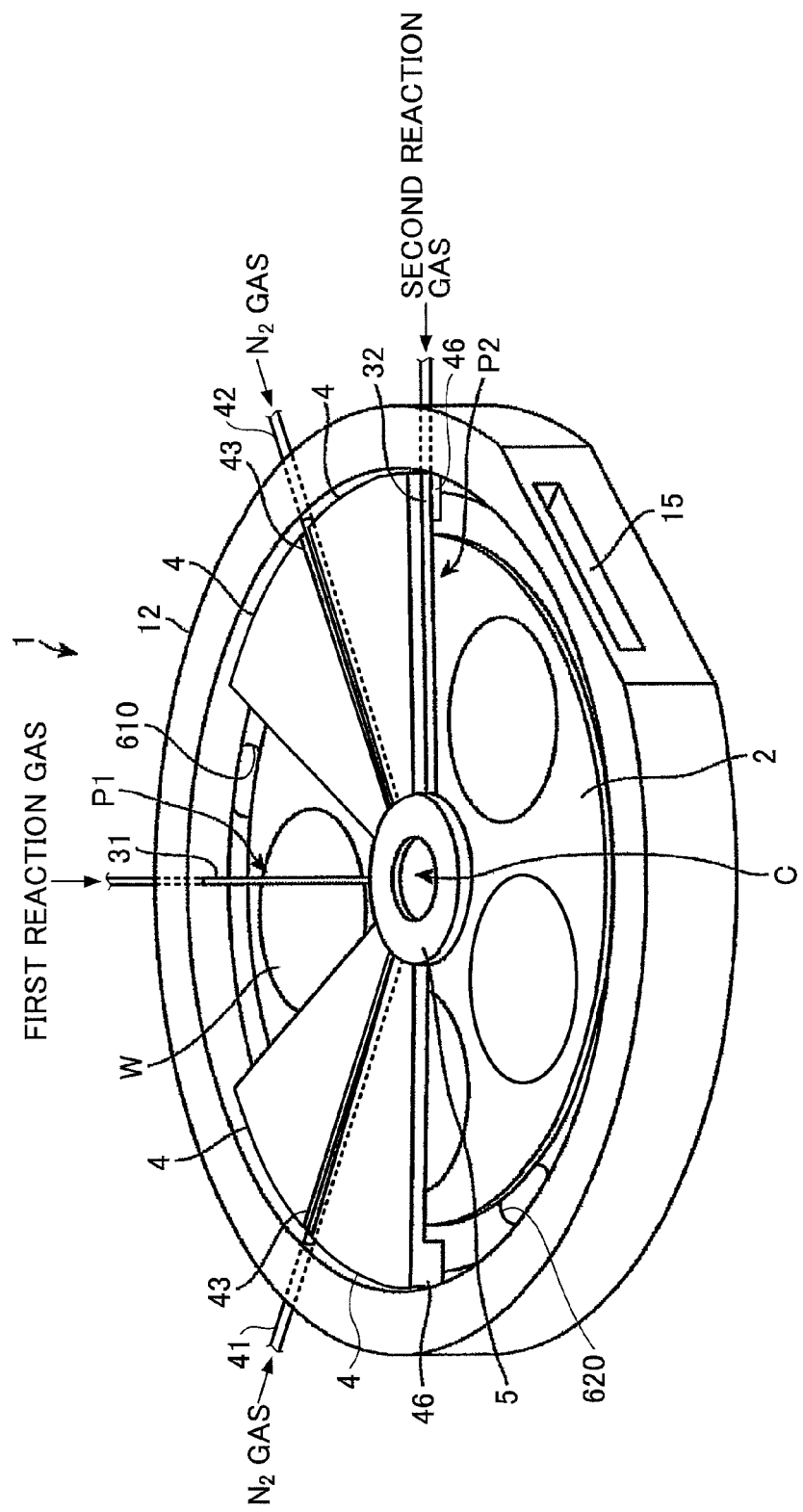
FIG. 2 is a perspective view for illustrating a structure inside a vacuum chamber of the film deposition apparatus illustrated in FIG. 1.
Figure 3:
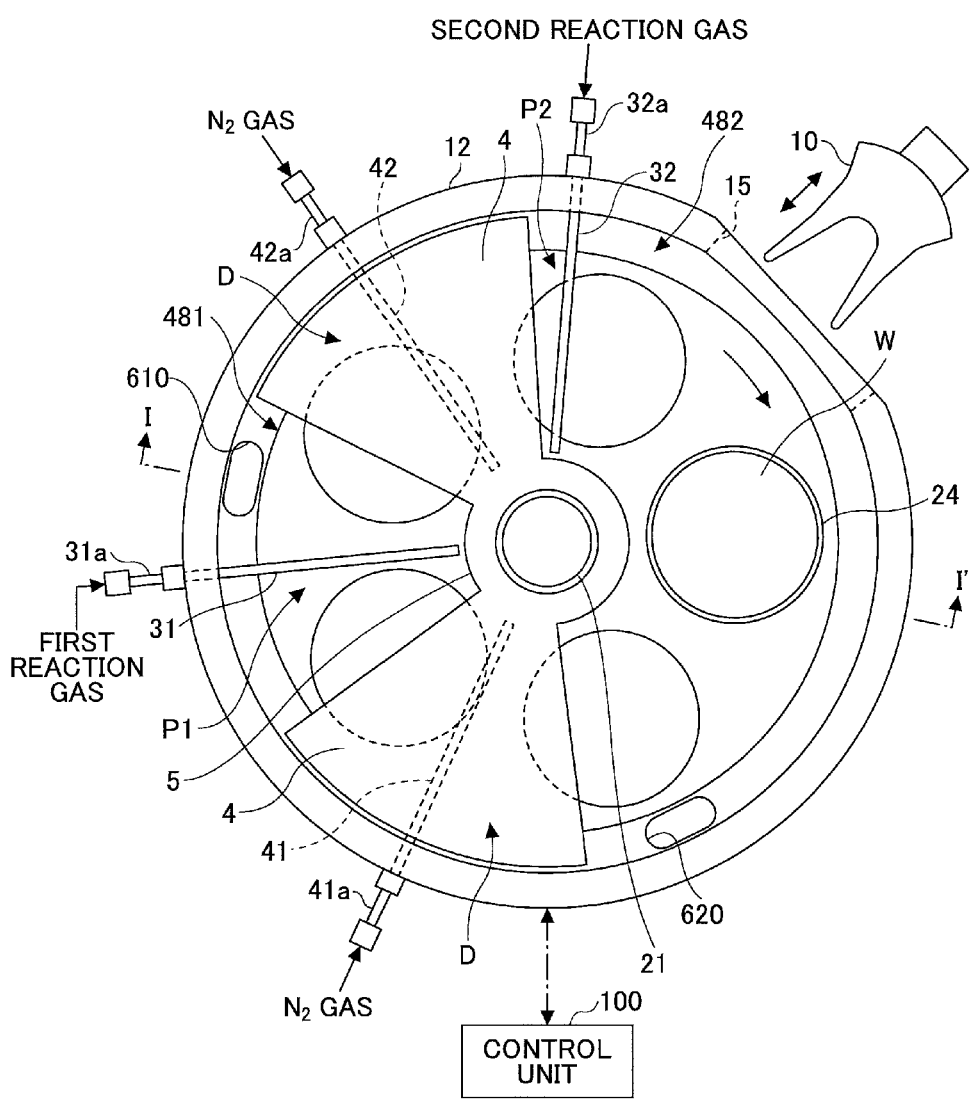
FIG. 3 is a schematic plan view for illustrating a structure inside the vacuum chamber of the film deposition apparatus illustrated in FIG. 1.

At first, referring to FIGS. 1 to 3, a film deposition apparatus suitable for performing a method of depositing a film of the first embodiment is described.

FIG. 1 is a cross-sectional view for illustrating a film deposition apparatus preferable for performing a method of depositing a film of the first embodiment of the present invention. FIG. 2 is a perspective view for illustrating a structure inside a vacuum chamber of the film deposition apparatus illustrated in FIG. 1. FIG. 3 is a schematic plan view for illustrating a structure inside the vacuum chamber of the film deposition apparatus illustrated in FIG. 1.

Referring to FIGS. 1 to 3, the film deposition apparatus of the first embodiment includes a chamber 1 having a substantially circular shape in its plan view and a flattened shape in its side view, and a turntable 2 having the rotational center in the center of the chamber 1. Referring to FIG. 1, the chamber 1 includes a chamber body 12 having a bottomed cylindrical shape, and a ceiling plate 11, which is detachably provided onto the upper surface of the chamber body 12 through a sealing member 13 (see FIG. 1) such as an O-ring to hermetically seal the chamber 1.

The turntable 2 is fixed by a core portion 21 in a cylindrical shape at the center portion of the turntable 2. The core unit 21 is fixed to the upper end of the rotational shaft 22 extending in the vertical direction. The rotational shaft 22 penetrates a bottom portion 14 of the chamber 1. The lower end of the rotational shaft 22 is attached to a driving mechanism 23, which causes the rotational shaft 22 (see FIG. 1) to rotate around the vertical axis of the rotational shaft 22. The rotational shaft 22 and the driving mechanism 23 are accommodated in a cylindrical case body 20 whose upper surface is opened. A flange on the upper surface of the case body 20 is hermetically attached to the lower surface of a bottom portion 14 of the chamber 1 to isolate the inner atmosphere from the outer atmosphere of the case body 20 and to maintain a gastight state between the inner atmosphere and the outer atmosphere of the case body 20.

An evacuation pipe 630 communicating with an evacuation port 610 is provided in an outer edge portion inside the chamber 1. The evacuation port 630 is connected to a vacuum pump 640 through a pressure adjuster 650 so that a gas is evacuated from the inside of the chamber 1 through the evacuation port 610.

Referring to FIG. 2 and FIG. 3, circular concave portions 24 for receiving a plurality of semiconductor wafers (5 wafers are illustrated in FIGS. 2 and 3) are provided on a surface of the turntable 2 along a rotational direction (a peripheral direction) of the turntable 2. FIG. 3 illustrates a state where the wafer W is mounted in only one circular concave portion 24 for convenience. The inner diameter of the circular concave portion 24 is slightly greater than the diameter (for example, 300 mm) of the wafer W by, for example, 2 mm. The depth of the circular concave portion 24 is substantially equal to the thickness of the wafer W. Therefore, when the wafer W is accommodated in the circular concave portion 24, the height of the surface of the wafer W is substantially the same as the height of the surface of the turntable 2 in an area where the wafer W is not mounted.

FIGS. 2 and 3 illustrate the structure inside the chamber 1. For convenience, the ceiling plate 11 is omitted in FIGS. 2 and 3. Referring to FIGS. 2 and 3, a reaction gas nozzle 31, a reaction gas nozzle 32, and separation gas nozzles 41 and 42, each is made of, for example, quartz, are arranged above the turntable 2. In FIGS. 2 and 3, the separation gas nozzle 41, the reaction gas nozzle 31, the separation gas nozzle 42, and the reaction gas nozzle 32 are sequentially arranged in a clockwise direction (the rotational direction of the turntable 2) from the transfer opening 15 (described below) at intervals in the peripheral direction of the chamber 1. These nozzles 31, 32, 41, and 42 are attached to the chamber body 12 by fixing gas introducing ports 31a, 32a, 41a, and 42a (see FIG. 3), which are base portions of the nozzles 31, 32, 41, and 42, respectively, to the outer peripheral wall of the chamber 1 so as to extend along radii of the chamber body 12 in parallel to the turntable 2.

A first reaction gas supplying source storing the first reaction gas is connected to the reaction gas nozzle 31 through an on-off valve (not illustrated) and a flow rate adjuster (not illustrated). A second reaction gas supplying source storing the second reaction gas is connected to the reaction gas nozzle 32 through an on-off valve (not illustrated) and a flow rate adjuster (not illustrated).

The first reaction gas is preferably a gas, which contains a metal element or a semiconductor element, and is selected so as to be used as an oxide film or a nitride film when the gas is changed to oxide or nitride. The second reaction gas is selected as an oxidation gas or a nitriding gas, with which a metal element or a semiconductor element reacts to produce metal oxide, metal nitride, semiconductor oxide, or semiconductor nitride. Specifically, the first reaction gas is preferably an organometallic gas (or a semiconductor gas) containing a metal element (or a semiconductor element). Further, the first reaction gas is preferably a gas having adsorptive property for the surface of the wafer W. The second reaction gas is preferably an oxidation gas or a nitriding gas, which can react with the first reaction gas adsorbed on the surface of the wafer 100 and whose reaction compound can be deposited on the surface of the wafer W.

Specifically, the first reaction gas is, for example, a reaction gas containing a hafnium element such as tetrakis(dimethylamino)hafnium (hereinafter, referred to as "TDMAH") provided to form hafnium oxide (generally referred to as "HfO" and may contain $HfO_2$) as the oxide film, a reaction gas containing a titanium element as the oxide film, or $TiCl_4$ or the like for forming TiN as the nitride film. The second reaction gas may be, for example, an ozone ($O_3$) gas as the oxidation gas or an ammonia ($NH_3$) gas as the nitriding gas.

A gas supplying source for supplying an inert gas such as a rare gas like Ar or He or a nitrogen ($N_2$) gas is connected to the separation gas nozzles 41 and 42 through an on-off valve (not illustrated) or a flow rate adjuster (not illustrated). A $N_2$ gas is used as the inert gas in the embodiment.

Figure 4:
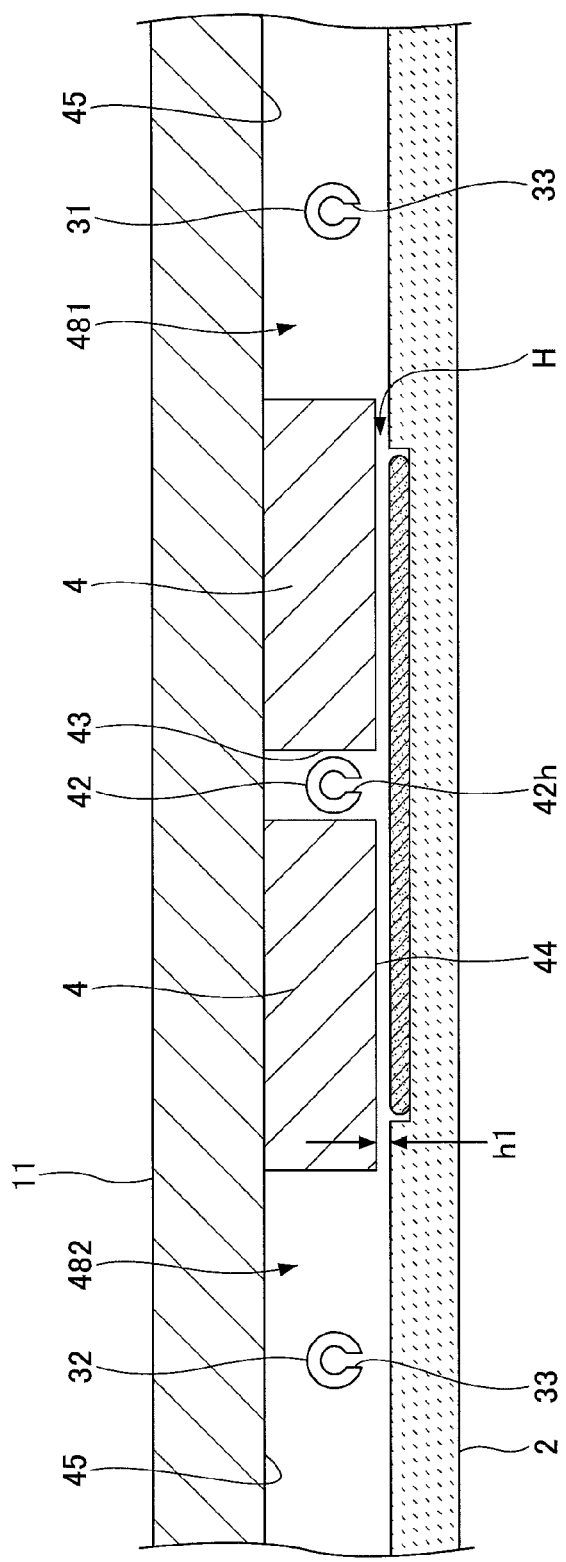
FIG. 4 is a cross-sectional view of a part of the film deposition apparatus, which includes a reaction gas nozzle and a separation gas nozzle and is illustrated in FIG. 1.

FIG. 4 is a cross-sectional view of a part of the film deposition apparatus, which includes the reaction gas nozzles 31 and 32 and the separation gas nozzle and is illustrated in FIG. 1. As illustrated in FIG. 4, a plurality of gas ejection holes 33 opening downward toward the turntable 2 are arranged in the reaction gas nozzles 31 and 32 along the longitudinal direction of the reaction gas nozzles 31 and 32 at intervals of, for example, 10 mm. As illustrated in FIG. 3, a lower area of the reaction gas nozzle 31 is a first process area 21 for causing the first reaction gas to adsorb onto the wafer W. The lower area of the reaction gas nozzle 32 is a second process area 22 where the first reaction gas adsorbed onto the wafer W in the first process area 21 is oxidized or nitrided. Lower areas of the separation gas nozzles 41 and 42 are separating areas D for separating the first process area P1 from the second process area P2 to prevent the first reaction gas and the second reaction gas from mixing.

Referring to FIGS. 2 and 3, two convex portions 4 are provided inside the chamber 1. The convex portions 4 have a substantially sector form in its plan view with its apex cut in a circular arc shape. Within this embodiment, an inner circular arc is connected to a ring-shaped protruding portion (described later), and an outer circular arc is arranged along an inner peripheral surface of the chamber body 12 of the chamber 1.

FIG. 4 is a cross-sectional view of the chamber 1 along a concentric circle of the turntable 2 from the reaction gas nozzle 31 to the reaction gas nozzle 32. As illustrated in FIG. 4, the convex portion 4 is attached to the back surface of the ceiling plate 11. Therefore, a flat and low ceiling surface 44 (a first ceiling surface) being a lower surface of the convex portion 4 and a high ceiling surface 45 (a second ceiling surface), which is positioned on both sides of the ceiling surface 44 and higher than the ceiling surface 44 exist inside the chamber 1.

Further, as illustrated in FIG. 4, a groove 43 is formed in the center in the peripheral direction of the convex portion 4 and extends along a radius direction of the turntable 2. The separation gas nozzle 42 is accommodated in the groove 43. Another groove portion 43 is similarly formed in another convex portion 4. The separation gas nozzle 41 is accommodated in the other groove portion 43. Referring to FIG. 4, a gas ejection hole 42h formed in the separation gas nozzle 42 is illustrated. A plurality of gas ejection holes 42h are formed along the longitudinal direction of the separation gas nozzle 42 at predetermined intervals (for example, 10 mm). An opening diameter of the gas ejection hole is, for example, 0.3 mm to 1.0 mm. Although it is omitted from the illustration, gas ejection holes are formed in the separation gas nozzle 41 in a manner similar thereto.

The reaction gas nozzles 31 and 32 are provided in spaces lower than the high ceiling surface 45. The reaction gas nozzles 31 and 32 are provided in the vicinity of the wafer W and apart from the ceiling surface 45. For convenience of explanation, the lower space of the ceiling surface 45 where the reaction gas nozzle 31 is provided is called a space 481, and the lower space of the ceiling surface 45 where the reaction gas nozzle 32 is provided is called a space 482.

A separation space H, which is narrow, is formed between the low ceiling surface 44 and the turntable 2. When the $N_2$ gas is supplied from the separation gas nozzle 42, the $N_2$ gas flows toward the spaces 481 and 482 through the separation space H. At this time, the volume of the separation space H is smaller than the volumes of the spaces 481 and 482. Therefore, the pressure of the separation space H can be set relatively higher than the pressures in the spaces 481 and 482 by the $N_2$ gas. Said differently, the separation space H provides a pressure barrier between the spaces 481 and 482. Further, the $N_2$ gas flowing from the separation space H to the spaces 481 and 482 works as counter flows against the first reaction gas from the first process area P1 and the second reaction gas (the oxidation gas or the nitriding gas) from the second process area P2. Therefore, the first reaction gas from the first process area P1 and the second reaction gas from the second process area P2 are separated by the separation space H. Therefore, it is possible to prevent mixture and reaction of the first reaction gas and the oxidation gas or the nitriding gas in the chamber 1.

It is preferable to set the height h1 of the ceiling surface 44 relative to the upper surface of the turntable 2 suitable for increasing the pressure in the separation space H higher than the pressures in the spaces 481 and 482 in consideration of the pressure inside the chamber 1 at the time of depositing the film, the rotational speed of the turntable 2, the supply amount of the separation gas (the $N_2$ gas), or the like.

As illustrated in FIGS. 1 to 3, the ring-shaped protruding portion 5 surrounding the outer periphery of the core portion 21, to which the turntable 2 is fixed, is provided under the lower surface of the ceiling plate 11. The ring-shaped protruding portions is continuously formed from the convex portions 4 at portions on a side of the rotation center of the convex portions 4. The lower surface of the ring-shaped protruding portion 5 has substantially the same height as that of the ceiling surface 44.

Figure 5:
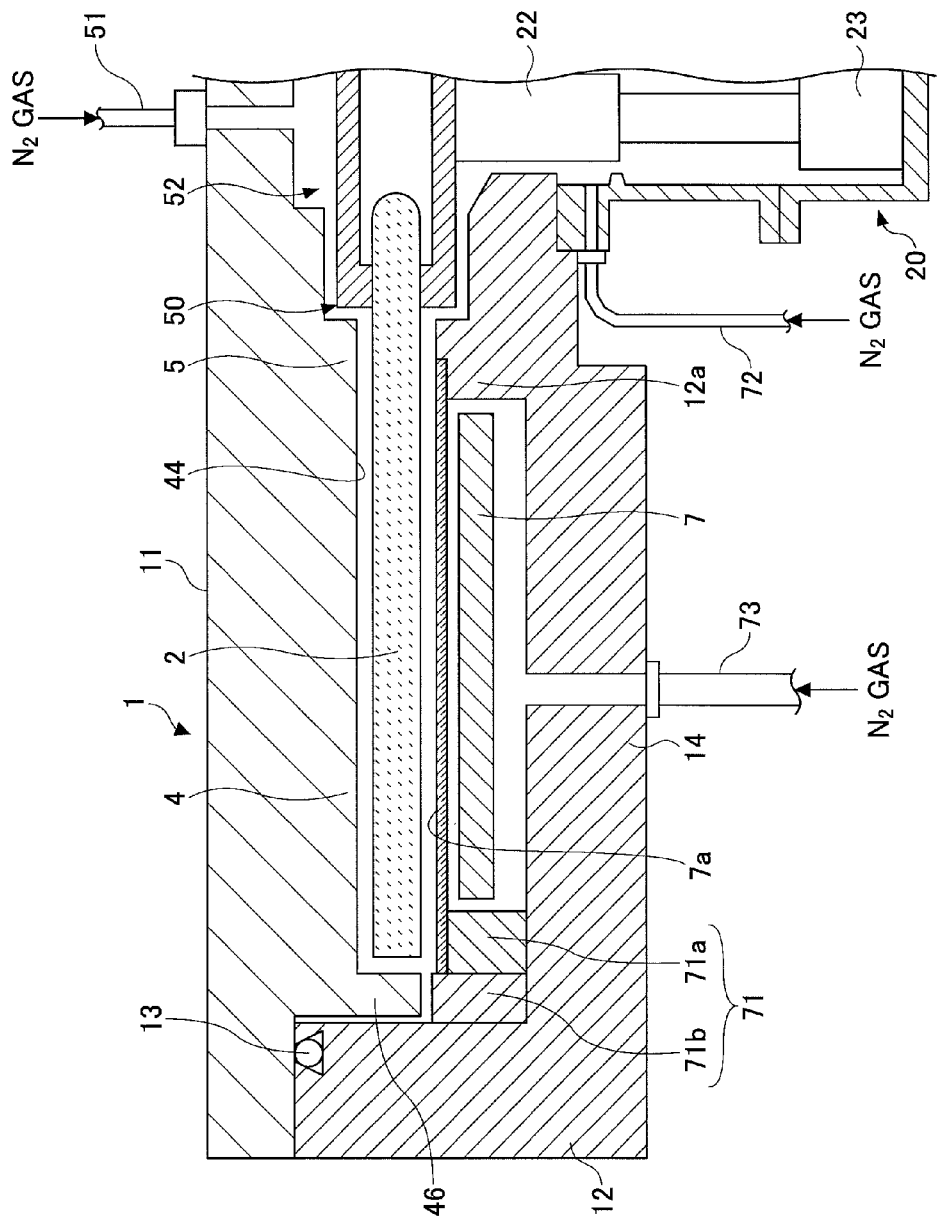
FIG. 5 is a cross-sectional view of another part of the film deposition apparatus, which includes a ceiling surface and is illustrated in FIG. 1.

FIG. 1 is a cross-sectional view taken along a line I-I' of FIG. 3. Referring to FIG. 3, an area provided with the ceiling surface 45 is illustrated. Meanwhile, FIG. 5 illustrates a cross-sectional view of a part of the area where the ceiling surface is provided. As illustrated in FIG. 5, a peripheral edge portion (a portion of the chamber 1 on the outer edge side) of the convex portion 4 in a sector-like shape has a bent portion 46 bent in a L-like shape so as to face the outer end surface of the turntable 2. The bent portion 46 prevents communication of the gas between the space 481 and the space 482 through a space between the turntable 2 and the inner peripheral surface of the chamber body 12. The convex portion 4 in the substantially sector form is provided in the ceiling plate 11. Because the ceiling plate 4 is detachable from the chamber body 12, there is a small gap between the outer peripheral surface of the bent portion 46 and the chamber body 12. A gap between the inner peripheral surface of the bent portion 46 and the outer edge surface of the turntable 2 and a gap between the outer peripheral surface of the bent portion 46 and the chamber body 12 are set to have a dimension similar to, for example, that of a gap between the ceiling surface 44 and the upper surface of the turntable 2.

Referring again to FIG. 3, the first evacuation port 61 communicating with the space 481 and a second evacuation port 62 communicating with the space 482 are formed between the turntable 2 and the inner peripheral surface of the chamber body. Referring to FIG. 1, the first and second evacuation ports 610 and 620 are connected to, for example, a vacuum pump 640 being an evacuating means through exhaust pipes 630.

As illustrated in FIGS. 1 and 5, a heater unit 7 being a heating means is provided in a space between the turntable 2 and the bottom portion 14 of the chamber 1. The wafer W on the turntable 2 is heated through the turntable 2 to have a temperature determined in a process recipe (for example, 450° C.). A ring-like cover member 71 is provided on the lower side of the periphery of the turntable 2 to prevent the gas from intruding into the space below the turntable 2. The cover member 71 includes an inner member 71a provided in a position vertically corresponding to the outer edge portion of the turntable 2 and to an outer peripheral side outer than the outer edge portion of the turntable 2, and an outer member 71b provided between the inner member 71a and the inner wall surface of the chamber 1. The outer member 71b is provided in the vicinity of the bent portion 46 formed on the outer edge portion of the convex portion 4 under the bent portion 46. The inner member 71a surrounds the entire periphery of the heater unit 7 and is positioned under the outer edge portion and a portion slightly outer than the outer edge portion of the turntable 2.

A part of the bottom portion 14 closer to the rotation center than the space where the heater unit 7 is arranged has a ring-shaped protruding portion 12a protruding upward so as to approach the core portion 21, which is provided in the vicinity of the center portion of the lower surface of the turntable 2. A narrow space is formed between the ring-shaped protruding portion 12a and the core portion 21. Further, there is a narrow gap between the inner peripheral surface of the through hole for the rotational shaft 22 penetrating through the bottom portion 14 and the rotational shaft 22. The narrow space communicates with the case body 20. A purge gas supplying pipe 72 is provided in the case body 20 so that the $N_2$ gas being the purge gas is supplied into the narrow space to purge the narrow space. In the bottom portion 14 of the chamber 1, a plurality of purge gas supplying pipes 73 are provided to purge a space where the heater unit 7 is arranged under the heater unit 7 at intervals of a predetermined angle in the peripheral direction (only one purge gas supplying pipe 73 is illustrated in FIG. 5). Further, a lid member 7a is provided between the heater unit 7 and the turntable 2. The lid member 7a prevents the gas from intruding into an area where the heater unit 7 is installed by covering an area between the inner peripheral wall of the outer member 71b (the upper surface of the inner member 71a) and the upper end portion of the ring-shaped protruding portion 12a along the peripheral direction. The lid member 7a is made of, for example, quartz.

When the $N_2$ gas is supplied from the purge gas supplying pipe 72, the $N_2$ gas flows through a gap between the inner peripheral surface of the through hole for the rotational shaft 22 and the rotational shaft 22, a gap between the ring-shaped protruding portion 12a and the core portion 21, and a space between the turntable 2 and the lid member 7a, and is evacuated from the first evacuation port 610 or the second evacuation port 620 (FIG. 3). Further, when the $N_2$ gas is supplied from the purge gas supplying pipe 73, the $N_2$ gas flows from the space where the heater unit 7 is accommodated out of the a gap (not illustrated) between the lid member 7a and the inner member 71a, and is evacuated from the first evacuation port 610 or the second evacuation port 620 (FIG. 3). By these flows of the $N_2$ gas, it is possible to prevent the gases inside the spaces 481 and 482 from mixing by the gases passing through a space at a center lower space of the chamber 1 and a lower space of the turntable 2.

A separation gas supplying tube 51 is connected to a center portion of the ceiling plate 11 of the chamber 1. The separation gas of the $N_2$ gas is supplied to a space 52 between the ceiling plate 11 and the core portion 21. The separation gas supplied to the space 52 is discharged toward the periphery of the turntable 2 along the surface on the side of a wafer mounting area of the turntable 2 through a space (a narrow gap) 50 between the ring-shaped protruding portion 5 and the turntable 2. The space 50 is maintained to have a pressure higher than those of the spaces 481 and 482 by the separation gas. Therefore, it is possible to prevent the first reaction gas supplied to the first process area P1 and the second reaction gas supplied to the second process area P2 from mixing after passing through the center area C. Said differently, the space 50 (or the center area C) functions in a manner similar to the separation space H (or the separating area D).

As illustrated in FIGS. 2 and 3, a transfer opening 15 is formed in the side wall of the chamber 1 for serving and receiving the wafer W being the substrate between a transfer arm 10 provided outside the chamber 1 and the turntable 2. The transfer opening 15 is opened and closed by a gate valve (not illustrated). Further, lift pins (not illustrated) for lifting the wafers from these back surfaces and a lifting mechanism (not illustrated) are provided in the circular concave portions 24 being the wafer mounting area of the turntable 2. The wafers W are served and received at a position corresponding to the transfer opening 15. Therefore, the lift pins penetrate the circular concave portions 24 from a lower surface of the turntable 2 to bring the wafers W to the position where the wafers W are served and received with the transfer arm 10.

Further, as illustrated in FIG. 1, the film deposition apparatus of the embodiment includes a control unit 100 including a computer for controlling operations of the entire film deposition apparatus. A memory of the control unit 100 stores a program causing the film deposition apparatus to perform a method of depositing a film described below under a control of the control unit 100. This program includes groups of steps for performing the method of depositing the film as described below and is stored in a medium 102 such as a hard disk, a compact disk, a magnet-optical disk, a memory card, a flexible disk, or the like. The program is read in a memory unit 101 by a predetermined reading device and is installed inside the control unit 100.

(Method of Depositing Film)

Next, a method of depositing a film of the first embodiment of the present invention using the film deposition apparatus described in FIGS. 1 to 5 is described.

FIG. 6A is a sequential diagram illustrating an example of the method of depositing the film of the first embodiment of the present invention by using a turntable. FIG. 6B is a timing chart illustrating the example of the method of depositing the film of the first embodiment of the present invention.

Referring to FIG. 6A, the turntable 2, the first process area P1 and the reaction gas nozzle 31, the second process area P2, the reaction gas nozzle 32, the separating area D and the separation gas nozzles 41 and 42 are simply illustrated. Within the method of depositing a film of the first embodiment, an example of an oxide film forming process for depositing hafnium oxide (generally referred to as "HfO" and may contain $HfO_2$, hereinafter other oxide films and nitride films are generally abbreviated accordingly, where necessary) is explained. Further, HfO has a high electric permittivity such as a so called high-k film.

Before performing the film deposition process illustrated in FIGS. 6A and 6B, it is necessary that the wafer W is transferred into the chamber 1 and mounted on the turntable 2. For this, at first, a gate valve (not illustrated) is opened. The wafer W is served into the circular concave portion 24 of the turntable 2 through the transfer opening 15 (FIG. 3) by the transfer arm 10. When the circular concave portion 24 is stopped at a position facing the transfer port 15, the lift pin (not illustrated) lifts up or down from the bottom portion side of the chamber 1 through the through hole in the bottom surface of the circular concave portion 24 to serve or receive the wafer W. The wafer W is served and received while the turntable 2 is intermittently rotated to thereby mount the wafers W inside five of the circular concave portions 24.

Subsequently, the gate valve is closed, and the chamber 1 is evacuated by the vacuum pump 640 to have a minimum degree of vacuum. From this state, the film deposition process illustrated in FIGS. 6A and 6B is performed as follows.

Referring to FIG. 6A, a stand-by process is performed in step 1. In the stand-by process, the $N_2$ gas being a separation gas is discharged from the separation gas nozzles 41 and 42 at a predetermined flow rate, and the $N_2$ gas is also discharged from the separation gas supplying pipe 51 and the purge gas supplying pipes 72, 72 at a predetermined flow rate (see FIG. 1). The $N_2$ gas is discharged from the reaction gas nozzles 31 and 32 at a predetermined flow rate. Resultantly, the $N_2$ gas is discharged from all nozzles 31, 32, 41, and 42. With this, the atmosphere inside the chamber 1 becomes a $N_2$ atmosphere. At this time, the pressure adjuster 650 adjusts the inside of the chamber 1 to have a predetermined process pressure. Subsequently, the wafer W is heated to be, for example, a range of 50° C. to 600° C. by the heater unit 7 while the turntable 2 is rotated at a predetermined rotational speed in a clockwise direction. With this, the stand-by state where the film deposition process is ready is prepared. The rotational speed of the turntable 2 is variable in a range of, for example, 1 rpm to 240 rpm depending on the intended use. However, in the method of depositing the film of the first embodiment, an example that the turntable 2 is rotated at the rotational speed of 6 rpm is explained.

Within the first embodiment, the $N_2$ gas is purged not only from the separation gas nozzles 41 and 42 but also from the reaction gas nozzles 31 and 32. For example, a rare gas such as an Ar gas or a He gas may be supplied from the reaction gas nozzles 31 and 32. This change is similarly applicable to the separation gas nozzles 41 and 42. A desirable inert gas can be selected depending on the intended use.

In step 2, a pre-flow process of the oxidation gas is performed. In the pre-flow process of the oxidation gas, the $N_2$ gas is continuously supplied from the reaction gas nozzle 31 in the first process area P1 and the separation gas nozzles 41, 42. However, an $O_3$ gas is supplied as the oxidation gas from the reaction gas nozzle 32 in the second process area P2. The above state is maintained while the wafer W on the turntable 2 rotates by at least one turn. The wafer W continues to rotate at a predetermined rotational speed. The rotational speed in the first embodiment is 6 rpm. The pre-flow process of the oxidation gas is provided to cause the entire surface of the wafer W to be exposed to the oxidation gas. A thin oxide film is deposited onto the surface of the wafer W. With this, the $O_3$ gas is supplied to each of the plurality of wafers W so that the wafers W are oxidized. Thus, the wafers W can be made substantially in the same condition. The reason why the turntable 2 is rotated by at least one turn is that the $O_3$ gas is supplied only from the reaction gas nozzle 32, and it is necessary to cause all the wafers W to pass through the lower area of the reaction gas nozzle 32 by at least the one turn of the turntable 2 in order to supply the $O_3$ gas onto the surfaces of all the plurality of wafers W irrespective of the position of the reaction gas nozzle 32 relative to the plurality of wafers W at the time of starting supplying the $O_3$ gas.

As illustrated in FIG. 63, the $O_3$ gas is supplied for ten seconds at a rotational speed of 6 rpm in the pre-flow process of the oxidation gas of the method of depositing the film. Therefore, in the pre-flow process of the oxidation gas of the method of depositing the film of the first embodiment, the turntable 2 is rotated by 1 turn=(6 turns/60 seconds)×10 seconds.

The supply of the $O_3$ gas may be performed during a plurality of turns of the wafer W as long as the process does not require a restriction of minimizing the oxidation. Therefore, the wafer W may be turned more than one turn under the state where the $O_3$ gas is being supplied. For example, the wafer W may be turned by, for example, 2 or 3 turn or 1.5 turns having a fraction in the pre-flow process of the oxidation gas.

In step 3, a film deposition process of depositing HfO is performed. In the film deposition process of depositing HfO, a TDMAH gas is supplied from the reaction gas nozzle 31 to the wafer W and the $O_3$ gas is supplied from the reaction gas nozzle 32. Said differently, the TDMAH gas and the $O_3$ gas are simultaneously supplied in the film deposition process of depositing HfO. However, because these gases are separated by the separating area D, they are hardly mixed inside the chamber 1.

When the TDMAH gas and the $O_3$ gas are simultaneously supplied, the wafer W passes through the first process area P1 by the rotation of the turntable 2. Then, a TDMAH gas adsorbs onto the surface of the wafer W on which the thin oxide film is deposited in step 2. Subsequently, after the wafer W passes through the second process area P2, the TDMAH gas adsorbing onto the surface of the wafer W is oxidized by the $O_3$ gas. Thus, a HfO film (a molecular layer of HfO) is formed on the surface of the wafer W. Thereafter, the turntable 2 is rotated by a predetermined number of times until the HfO film having a predetermined film thickness is formed. Then, the film deposition process of depositing HfO is finished by stopping the supply of the TDMAH gas and the $O_3$ gas.

Referring to FIG. 6B, the $O_3$ gas is continuously supplied from pre-flow process of the oxidation gas to the film deposition process of depositing HfO in step 3, and the TDMAH gas is supplied in the film deposition process of depositing HfO. The rotational speed of the turntable 2 is maintained at 6 rpm, and the film deposition cycle of rotating by one turn for 10 seconds are repeated by n times when necessary. Although the number n of turns of the turntable 2 may be determined depending on the film thickness of the HfO film deposited in the film deposition process of depositing HfO, the number n of turns may be set to, for example, a predetermined number n of turns in a range of 1 to 50 times or a predetermined number n of turns in a range of 1 to 30 times.

In step 4, the post-flow process of the oxidation gas is performed. In the post-flow process of the oxidation gas, the $N_2$ gas is supplied from the reaction gas nozzle 31 provided in the first process area P1 and the separation gas nozzles 41 and 42 provided in the separating area D, and the $O_3$ gas is supplied from the reaction gas nozzle 32 provided in the second process area P2. Under this condition, the turntable 2 rotates by at least one turn, and all the plurality of wafers W mounted on the turntable 2 are exposed to the $O_3$ gas. With this, the wafer W, whose film deposition process of depositing HfO of step 3 is finished while passing through the second process area P2, inevitably passes through the second process area P2 in the post-flow process of the oxidation gas. Then, oxidation treatment is performed. Thus, the film deposition process of depositing HfO can be completely finished after the oxidation treatment is performed.

As illustrated in FIG. 6B, in the post-flow process of the oxidation gas of the method of depositing the film of the second embodiment, the turntable 2 rotates for 10 seconds while the rotational speed is maintained to be 6 rpm so that the turntable 2 rotates by one turn in a manner similar to the pre-flow process of the oxidation gas. As described, the numbers of turns of the turntable 2 both in the pre-flow process of the oxidation gas and the post-flow process of the oxidation gas may be the same.

Referring to FIG. 6A, a stand-by process is performed in step 5. In the stand-by process, the $N_2$ gas is supplied from all nozzles 31, 32, 41, and 42 of the reaction gas nozzles 31 and 32 and the separation gas nozzles 41 and 42. The inside of the chamber 1 is filled with the $N_2$ gas. After continuing the stand-by process for a predetermined time, the supply of the $N_2$ gas to the chamber 1 is stopped and the rotation of the turntable 2 is stopped. Thereafter, the wafer W is carried out of the chamber 1 by an inverse process of the process transferring the wafer W inside the chamber 1. With this, the film deposition process of depositing HfO is finished.

Within the method of depositing the film of the first embodiment illustrated in FIG. 6B, the pre-flow process of the oxidation gas and the post-flow process of the oxidation gas are provided before and after the film deposition process of depositing HfO to supply the $O_3$ gas as the reaction gas. As a result, there exists no wafer W supplied with the TDMAH gas without being exposed to the $O_3$ gas among the plurality of wafers arranged along the circumferential direction on the turntable 2. Thus, film deposition among the plurality of wafers W are made uniform.

FIG. 7 is a sequential diagram illustrating an example of a conventional method of depositing a film by using a turntable as a comparative example. Referring to FIG. 7, in the conventional method of depositing the film, the film deposition process of depositing HfO in step 2 comes immediately after the stand-by process in step 1. At the time of starting the film deposition process of depositing HfO, the wafers W existing in the separating area D on the downstream side of the first process area P1 and in the second process area P2 are oxidized by being exposed to the $O_3$ gas and thereafter enter into the first process area. However, the wafers W in the separating area D on the downstream side of the second process area P2 and in the first process area P1 are directly supplied with the TDMAH gas. With this, there exists the wafer W, on which the HfO film starts to be deposited after the oxide film is deposited on the surface of the wafer W, and the other wafer W, on which the HfO film starts to be deposited without the oxide film deposited on the surface of the wafer W. Therefore, uniform film deposition may not be performed among the plurality of wafers W. Further, because the stand-by process in step 3 starts after finishing the film deposition of HfO, only the TDMAH gas is supplied. In this case, the TDMAS gas adsorbing onto the surface of the wafer W is not oxidized, and as a result, the wafer W is produced without having the HfO film after the film deposition process of depositing HfO.

Therefore, within the method of depositing the film of the first embodiment, as illustrated in FIGS. 6A and 63, the pre-flow process of the oxidation gas and the post-flow process of the oxidation gas are provided to deposit the HfO films after forming the oxide films on the surfaces of all the plurality of wafers. Therefore, it is possible to prevent the wafer W adsorbing only the TDMAH gas without the oxidation treatment from being carried out in the chamber 1 so that the HfO film is uniformly deposited on all the wafers W.

Referring to FIGS. 6A and 6B, the example that the rotational speed of the turntable 2 is 6 rpm and the number of turns of the turntable 2 in the pre-flow process of the oxidation gas and the post-flow process of the oxidation gas is one is described. However, the rotational speed and the number of turns can be variously changed depending on the intended use as long as the numbers of turns of the turntable 2 in the pre-flow process of the oxidation gas and the post-flow process of the oxidation gas are made one turn or greater.

Referring to FIGS. 6A and 6B, the example that the HfO film to be deposited in the film deposition process of the HfO film is the High-k film is described. However, a desirable oxide film can be deposited by variously changing the reaction gas supplied from the reaction gas nozzle 31 depending on the intended use.

Further, referring to FIGS. 6A and 6B, the example that the $O_3$ gas is used as the oxidation gas is described. However, various oxidation gases can be used. For example, a gas including water ($H_2O$), oxygen, or radical oxygen may be used.

For example, a tetrakis(ethylmethylamino)zirconium (TEMAZ) gas as one type of an organometallic gas containing Zr may be supplied from the reaction gas nozzle 31 provided in the first process area P1, and the $O_3$ gas may be supplied from the reaction gas nozzle 32 provided in the second process area P2 to deposit a film of zirconium oxide (zirconium oxide may include ZrO and/or $ZrO_2$).

Similarly, a trimethylaluminum (TMA) gas may be supplied from the reaction gas nozzle 31 provided in the first process area P1, and the $O_3$ gas may be supplied from the reaction gas nozzle 32 provided in the second process area P2 to deposit a film of aluminum oxide (aluminum oxide may include AlO and/or $Al_2O_3$).

Further, a strontiumbis-tetramethylheptanedionato (Sr$(THD)_2$) gas may be supplied from the reaction gas nozzle 31, and the $O_3$ gas may be supplied from the reaction gas nozzle 32 to deposit a strontium oxide (SrO) film.

Further, titaniummethylpentanedionatobis-tetramethylheptanedionato (Ti(MPD)(THD)) gas may be supplied from the reaction gas nozzle 31, and the $O_3$ gas may be supplied from the reaction gas nozzle 32 to deposit a film of titanium oxide (titanium oxide may include TiO and/or $TiO_2$).

Further, for example, a bis(tertiary-butylamino)silane (BT-BAS) gas as an organic aminosilane material may be supplied from the reaction gas nozzle 31 and the $O_3$ gas is supplied from the reaction gas nozzle 32 to deposit a film of silicon oxide (silicon oxide may include SiO and/or $SiO_2$).

Similarly, a bis(tertiary-butylamino)silane (BTBAS) gas may be supplied from the reaction gas nozzle 31, and the $O_3$ gas may be supplied from the reaction gas nozzle 32 to deposit a silicon oxide (SiC) film.

As described, the element contained in the oxide film may be a metal element such as hafnium, zirconium, aluminum, titanium, or strontium or a semiconductor element such as silicon.

Although the number of turns in the pre-flow process of the oxidation gas and the number of turns in the post-flow process of the oxidation gas are the same, namely the process time period of the pre-flow process of the oxidation gas and the process time period of the post-flow process of the oxidation gas are the same, as in FIGS. 6A and 6B, the process time period of the post-flow process of the oxidation gas may be set longer than the process time period of the pre-flow process of the oxidation gas. Among the above various film deposition processes, the supply of the oxidation gas in the post-flow process of the oxidation gas may be provided not only to provide uniform film deposition on the plurality of wafers W but also to improve film quality after depositing the films. Said differently, the oxidation gas may further be supplied after forming a predetermined oxide film to sufficiently oxidize. Thus, the film quality of the oxide film after depositing the film can be enhanced. In this case, a sufficient time is allocated to the post-flow process of the oxidation gas to simultaneously perform a film quality improving process. For example, in a case where the silicon oxide film is deposited in the above example, the rotational speed of the turntable 2 may be 120 rpm, the pre-flow process of the oxidation gas may continue for 6 seconds to thereby rotate the turntable 2 by 12 turns, and the post-flow process of the oxidation gas may continue for 30 seconds to thereby rotate the turntable 2 by 60 turns. In the case of the silicon oxide film, it is preferable to cause oxygen to reach silicon in the film so that reaction becomes sufficient. By spending a sufficient time for the post-flow process of the oxidation gas, the film quality of the oxide film can be improved.

The number of turns of the wafers W in the pre-flow process of the oxidation gas and the number of turns of the wafers W in the post-flow process of the oxidation gas may not be the same, said differently, the process time period of the pre-flow process of the oxidation gas and the process time period of the post-flow process of the oxidation gas may not be the same. Depending on an intended use, an appropriate number of turns or an appropriate process time period may be set. In the post-flow process of the oxidation gas, the number of turns of the turntable 2 or the process time period may be set so that not only uniform supply of the oxidation gas but also improvement in the film quality of the deposited oxide film are performed.

Second Embodiment

FIG. 8A is a sequential diagram illustrating an example of a method of depositing a film of a second embodiment of the present invention by using a turntable. FIG. 8B is a timing chart illustrating an example of the method of depositing the film of the second embodiment of the present invention. Referring to FIG. 8A, the gas supplied from the reaction gas nozzles 31 and 32 is different from that in FIG. 6A. However, other parts are similar to FIG. 6A. Therefore, the same reference symbols as those in FIG. 6A are attached to these parts in FIG. 8A, and the description thereof is omitted.

In the method of depositing the film of the second embodiment, an example of depositing a nitride film on the wafer W is described. Specifically, an example of depositing a TiN film is described. Further, the method of depositing the film of the second embodiment can be performed by using the film deposition apparatus described in the method of depositing the film of the first embodiment. Therefore, the description of the film deposition apparatus to be used is omitted.

Before performing the film deposition process illustrated in FIGS. 8A and 8B, the wafer W is transferred into the chamber 1 so as to be mounted on the turntable 2. Therefore, a gate valve (not illustrated) is opened and the wafer W is served to the circular concave portion 24 of the turntable 2 through the transfer opening 15 (see FIG. 3) by the transfer arm 10. This operation is repeated to mount the wafers W into the five circular concave portion 24 of the turntable 2. Subsequently, the gate valve is closed, and the chamber 1 is evacuated by the vacuum pump 640 to have a minimum degree of vacuum. From this state, the film deposition process illustrated in FIGS. 8A and 8B is performed as follows. Because a transfer process is similar to that in the first embodiment, detailed description of the transfer process is omitted.

Referring to FIG. 8A, a stand-by process is performed in step 1. In the stand-by process, the $N_2$ gas being a separation gas is discharged from the separation gas nozzles 41 and 42 at a predetermined flow rate, and the $N_2$ gas is also discharged from the separation gas supplying pipe 51 and the purge gas supplying pipes 72, 72 at a predetermined flow rate (see FIG. 1). The other components are similar to those of FIG. 6A, and description of these components is omitted. The $N_2$ gas is discharged also from the reaction gas nozzles 31 and 32 at a predetermined flow rate. The rotational speed of the turntable 2 is variable in a range of, for example, 1 rpm to 240 rpm depending on the intended use. However, in the method of depositing the film of the second embodiment, an example that the turntable 2 is rotated at the rotational speed of 240 rpm is explained.

In step 2, a pre-flow process of a nitriding gas is performed. In the pre-flow process of the nitriding gas, the $N_2$ gas is continuously supplied from the reaction gas nozzle 31 in the first process area P1 and the separation gas nozzles 41, 42. However, an $NH_3$ gas is supplied as the nitriding gas from the reaction gas nozzle 32 in the second process area P2. The above state is maintained while the wafer W on the turntable 2 rotates by at least one turn. The wafer W continues to rotate at a predetermined rotational speed. The rotational speed in the second embodiment is 240 rpm. The pre-flow process of the nitriding gas is provided to cause the entire surface of the wafer W to be exposed to the nitriding gas. A thin nitride film is deposited onto the surface of the wafer W. With this, the $NH_3$ gas is supplied to each of the plurality of wafers W so that the wafers W are nitrided. Thus, the wafers W can be made substantially in the same condition. The reason why the turntable 2 is rotated by at least one turn is that the $NH_3$ gas is supplied only from the reaction gas nozzle 32, and it is necessary to cause all the wafers W to pass through the lower area of the reaction gas nozzle 32 by at least the one turn of the turntable 2 in order to supply the $NH_3$ gas onto the surfaces of all the plurality of wafers W irrespective of the position of the reaction gas nozzle 32 relative to the plurality of wafers W at the time of starting supplying the $NH_3$ gas.

As illustrated in FIG. 8B, the $NH_3$ gas is supplied for five seconds at a rotational speed of 240 rpm in the pre-flow process of the nitriding gas of the method of depositing the film. Therefore, in the pre-flow process of the nitriding gas of the method of depositing the film of the second embodiment, the turntable 2 is rotated by 20 turns=(240 turns/60 seconds)×5 seconds.

The supply of the $NH_3$ gas may be performed during a plurality of turns of the wafer W as long as the process does not require a restriction of minimizing the nitridation. Therefore, the wafer W may be turned more than one turn under the state where the $NH_3$ gas is being supplied as in the second embodiment. On the contrary, in the pre-flow process of the nitriding gas, the wafer W may be rotated for 0.4 seconds to make the number of turns one turn or the number of turns may be 10.5 turns having a fraction.

In step 3, a film deposition process of depositing TiN is performed. In the film deposition process of depositing TiN, a $TiCl_4$ gas is supplied from the reaction gas nozzle 31 to the wafer W and the $NH_3$ gas is supplied from the reaction gas nozzle 32. In the film deposition process of depositing TiN, the $TiCl_4$ gas and the $NH_3$ gas are simultaneously supplied. However, because these gases are separated by the separating area D, they are hardly mixed inside the chamber 1.

When the $TiCl_4$ gas and the $NH_3$ gas are simultaneously supplied, the wafer W passes through the first process area 21 by the rotation of the turntable 2. Then, the $TiCl_4$ gas adsorbs onto the surface of the wafer W nitrided in step 2. Subsequently, after the wafer W passes through the second process area 2, the $TiCl_4$ gas adsorbing onto the surface of the wafer W is nitrided by the $NH_3$ gas. Thus, a TiN film (a molecular layer of TiN) is formed on the surface of the wafer W. Thereafter, the turntable 2 is rotated by a predetermined number of times until the TiN film having a predetermined film thickness is formed. The number of turns of the turntable 2 may be set to a predetermined number in a range of 1 to 50 turns or a predetermined number in a range of 1 to 30 turns. Then, the film deposition process of depositing TiN is finished by stopping the supply of the $TiCl_4$ gas and the supply of the $NH_3$ gas.

Referring to FIG. 8B, the $NH_3$ gas is continuously supplied from pre-flow process of the nitriding gas to the film deposition process of depositing TiN in step 3, and the $TiCl_4$ gas is supplied in the film deposition process of depositing TiN.

The rotational speed of the turntable 2 is maintained at 240 rpm, and the film deposition cycle of rotating by one turn for 0.25 seconds are repeated by n times when necessary.

In step 4, a post-flow process of the nitriding gas is performed. In the post-flow process of the nitriding gas, the $N_2$ gas is supplied from the reaction gas nozzle 31 provided in the first process area P1 and the separation gas nozzles 41 and 42 provided in the separating area D, and the $NH_3$ gas is supplied from the reaction gas nozzle 32 provided in the second process area P2. Under this condition, the turntable 2 rotates by at least one turn, and all the plurality of wafers W mounted on the turntable 2 are exposed to the $NH_3$ gas. With this, the wafer W whose film deposition process of depositing TiN of step 3 is finished while passing through the second process area P2 can completely pass through the second process area P2 in the post-flow process of the nitriding gas. Then, nitriding treatment is performed. Thus, the film deposition process can be completely finished after the nitriding treatment is performed.

As illustrated in FIG. 8B, in the post-flow process of the nitriding gas of the method of depositing the film of the second embodiment, the turntable 2 rotates for 5 seconds while the rotational speed is maintained to be 240 rpm so that the turntable 2 rotates by 20 turns in a manner similar to the pre-flow process of the nitriding gas. As described, the numbers of turns of the turntable 2 both in the pre-flow process of the nitriding gas and the post-flow process of the nitriding gas may be the same.

Referring to FIG. 8A, a stand-by process is performed in step 5. In the stand-by process, the $N_2$ gas is supplied from all nozzles 31, 32, 41, and 42 of the reaction gas nozzles 31 and 32 and the separation gas nozzles 41 and 42. The inside of the chamber 1 is filled with the $N_2$ gas. After continuing the stand-by process for a predetermined time, the supply of the $N_2$ gas to the chamber 1 is stopped and the rotation of the turntable 2 is stopped. Thereafter, the wafer W is carried out of the chamber 1 by an inverse process of the process transferring the wafer W inside the chamber 1. With this, the TiN film deposition process is finished.

Within the method of depositing the film of the second embodiment illustrated in FIG. 8B, the pre-flow process of the nitriding gas and the post-flow process of the nitriding gas are provided before and after the film deposition process of depositing TiN to supply the $NH_3$ gas as the reaction gas. As a result, there exists no wafer W supplied with the $TiCl_4$ gas without being exposed to the $NH_3$ gas among the plurality of wafers W arranged along the circumferential direction on the turntable 2. Thus, film deposition among the plurality of wafers W are made uniform.

Therefore, within the method of depositing the film of the second embodiment, as illustrated in FIGS. 8A and 8B, the pre-flow process of the nitriding gas and the post-flow process of the nitriding gas are provided to deposit the TiN films after forming the nitride films on the surfaces of all the plurality of wafers. Therefore, it is possible to prevent the wafer W adsorbing only the $TiCl_4$ gas without the nitriding treatment from being carried out in the chamber 1 so that the TiN film is uniformly deposited on all the wafers W.

Referring to FIGS. 8A and 8B, the example that the rotational speed of the turntable 2 is 240 rpm and the number of turns of the turntable 2 in the pre-flow process of the nitriding gas and the post-flow process of the nitriding gas is 240 is described. However, the rotational speed and the number of turns can be variously changed depending on the intended use as long as the number of turns of the turntable 2 in the pre-flow process of the nitriding gas and the post-flow process of the nitriding gas are made one turn or greater. For example, the rotational speed of the turntable 2 may be set to 120 rpm.

Further, the film deposition process illustrated in FIGS. 8A and 8B may be used for depositing the other nitride films. For example, a gas supplied from the reaction gas nozzle 31 in the first process area P1 may be a TDMAH gas and a gas supplied from the second reaction gas nozzle 32 of the second process area P2 may be the $NH_3$ to deposit a HfN film.

Similarly, a tetrakis(ethylmethylamino)zirconium (TEMAZ) gas as one type of an organometallic gas containing Zr may be supplied from the reaction gas nozzle 31 provided in the first process area P1, and the $NH_3$ gas may be supplied from the reaction gas nozzle 32 provided in the second process area P2 to deposit a zirconium nitride (ZrN) film.

Similarly, a trimethylaluminum (TMA) gas may be supplied from the reaction gas nozzle 31 provided in the first process area P1, and the $NH_3$ gas may be supplied from the reaction gas nozzle 32 provided in the second process area P2 to deposit an aluminum nitride (AlN) film.

Further, a strontiumbis-tetramethylheptanedionato (Sr(THD)$_2$) gas may be supplied from the reaction gas nozzle 31, and the $NH_3$ gas may be supplied from the reaction gas nozzle 32 to deposit a strontium nitride ($N_2Sr_3$) film.

Further, a bis(tertiary-butylamino)silane (BTBAS) gas may be supplied from the reaction gas nozzle 31, and the $NH_3$ gas may be supplied from the reaction gas nozzle 32 to deposit a silicon nitride (SiN) film.

In a manner similar to the above, a material of an organic aminosilane gas such as bis(tertiary-butylamino)silane (BTBAS) and an inorganic material such as dichlorosilane ($SiH_2Cl_2$) are supplied from the reaction gas nozzle 31, and the $NH_3$ gas is supplied from the reaction gas nozzle 32 to deposit a silicon nitride film (the silicon nitride film may include $Si_3N_4$).

As described, in the method of depositing the film of the second embodiment, a nitride film containing various elements can be deposited. For example, the element contained in the nitride film may be a metal element such as hafnium, zirconium, aluminum, titanium, or strontium or a semiconductor element such as silicon.

As described, according to the method of depositing the film of the second embodiment, the nitride film may be evenly deposited on the plurality of wafers.

According to the embodiments of the present invention, evenness of film deposition among a plurality of wafers can be improved.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film have been described in detail, it should be understood that the various changes, substitutions, and alterations could be made hereto without departing from the spirit and scope of the invention.

What is claimed is:

1. A method of depositing an oxide film containing a predetermined element on a plurality of substrates using a film deposition apparatus including
    a turntable that is accommodated in a chamber, is rotatable, and includes mounting portions formed on an upper surface of the turntable so that the substrates are mounted on the mounting portions,
    a first process area laid out above the upper surface of the turntable and being provided with a first gas supplying portion, which supplies gases toward the upper surface of the turntable,
    a second process area arranged apart from the first process area along a peripheral direction of the turntable and being provided with a second gas supplying portion, which supplies the gases toward the upper surface of the turntable, and
    a separation area including a separation gas supplying portion provided between the first process area and the second process area and supplying a separation gas onto the upper surface of the turntable, and a ceiling surface forming a narrow space so that the narrow space for introducing the separation gas supplied from the separation gas supplying portion to the first process area and the second process area is formed between the ceiling surface and the surface of the turntable, the method of depositing the film comprising:
    a substrate mounting process of mounting the plurality of substrates on the mounting portions of the turntable;

a first process of rotating the turntable while an inert gas is supplied from the first gas supplying portion, and the separation gas is supplied from each of the second gas supplying portion and the separation gas supplying portion, subsequent to the substrate mounting process;

a second process of rotating the turntable at least one turn while the separation gas is supplied from the first gas supplying portion and the separation gas supplying portion, and an oxidation gas is supplied from the second gas supplying portion, subsequent to the first process;

a third process of depositing the oxide film containing the predetermined element onto the substrates by rotating the turntable a predetermined number of turns while a reaction gas containing the predetermined element is supplied from the first gas supplying portion, the oxidation gas is supplied from the second gas supplying portion, and the separation gas is supplied from the separation gas supplying portion; and a fourth process of rotating the turntable at least one turn under a state where the separation gas is supplied from the first gas supplying portion and the separation gas supplying portion, and the oxidation gas is supplied from the second gas supplying portion.

2. The method of depositing the oxide film according to claim 1, wherein the predetermined number of turns is determined so as to be sufficient for depositing the oxide film containing the predetermined element so as to have a predetermined film thickness.

3. The method of depositing the oxide film according to claim 1, wherein the oxidation gas is an ozone gas.

4. The method of depositing the oxide film according to claim 1, wherein the predetermined element is a metal element or a semiconductor element.

5. The method of depositing the oxide film according to claim 4,
wherein the metal element is any one of hafnium, zirconium, aluminum, titanium, and strontium, and
the semiconductor element is silicon.

6. The method of depositing the oxide film according to claim 1, wherein the separation gas is an inert gas.

7. The method of depositing the oxide film according to claim 1, wherein a time period of performing the fourth process is longer than a time period of performing the second process.

8. The method of depositing the oxide film according to claim 1, further comprising:
a process of rotating the turntable while an inert gas is supplied from the first gas supplying portion and the separation gas is supplied from the second gas supplying portion and the separation gas supplying portion, the process being performed after the third process.

9. The method of depositing the oxide film according to claim 8, wherein the inert gas and the separation gas are a same gas.

10. A method of depositing a nitride film containing a predetermined element on a plurality of substrates using a film deposition apparatus including
a turntable that is accommodated in a chamber, is rotatable, and includes mounting portions formed on an upper surface of the turntable so that the substrates are mounted on the mounting portions,
a first process area laid out above the upper surface of the turntable and being provided with a first gas supplying portion, which supplies gases toward the upper surface of the turntable,
a second process area arranged apart from the first process area along a peripheral direction of the turntable and being provided with a second gas supplying portion, which supplies the gases toward the upper surface of the turntable,
a separation gas supplying portion provided between the first process area and the second process area and supplying a separation gas onto the upper surface of the turntable, and
a separation area including a ceiling surface forming a narrow space so that the narrow space for introducing the separation gas supplied from the separation gas supplying portion to the first process area and the second process area is formed between the ceiling surface and the surface of the turntable, the method of depositing the film comprising:
a substrate mounting process of mounting the plurality of substrates on the mounting portions of the turntable;
a first process of rotating the turntable while an inert gas is supplied from the first gas supplying portion, and the separation gas is supplied from each of the second gas supplying portion and the separation gas supplying portion, subsequent to the substrate mounting process;
a second process of rotating the turntable at least one turn while the separation gas is supplied from the first gas supplying portion and the separation gas supplying portion, and an nitriding gas is supplied from the second gas supplying portion, subsequent to the first process;
a third process of depositing the nitride film containing the predetermined element onto the substrates by rotating the turntable a predetermined number of turns while a reaction gas containing the predetermined element is supplied from the first gas supplying portion, the nitriding gas is supplied from the second gas supplying portion, and the separation gas is supplied from the separation gas supplying portion; and
a fourth process of rotating the turntable at least one turn under a state where the separation gas is supplied from the first gas supplying portion and the separation gas supplying portion, and the nitriding gas is supplied from the second gas supplying portion.

11. The method of depositing the nitride film according to claim 10, wherein the predetermined number of turns is determined so as to be sufficient for depositing the nitride film containing the predetermined element so as to have a predetermined film thickness.

12. The method of depositing the nitride film according to claim 10, wherein the nitriding gas is an ammonia gas.

13. The method of depositing the nitride film according to claim 10, wherein the predetermined element is a metal element or a semiconductor element.

14. The method of depositing the nitride film according to claim 13,
wherein the metal element is any one of hafnium, zirconium, aluminum, titanium, and strontium, and
the semiconductor element is silicon.

15. The method of depositing the nitride film according to claim 10, wherein the separation gas is a nitrogen gas.

16. The method of depositing the nitride film according to claim 10, further comprising:
a process of rotating the turntable while an inert gas is supplied from the first gas supplying portion and the separation gas is supplied from the second gas supplying portion and the separation gas supplying portion, the process being performed after the third process.

17. The method of depositing the nitride film according to claim 16, wherein the inert gas and the separation gas are a same gas.

* * * * *